(12) United States Patent
Lin

(10) Patent No.: US 7,382,661 B1
(45) Date of Patent: Jun. 3, 2008

(54) SEMICONDUCTOR MEMORY DEVICE HAVING IMPROVED PROGRAMMING CIRCUIT AND METHOD OF PROGRAMMING SAME

(75) Inventor: Yang-Chieh Lin, Tainan (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 4 days.

(21) Appl. No.: 11/672,406

(22) Filed: Feb. 7, 2007

(51) Int. Cl.
*G11C 16/00* (2006.01)
(52) U.S. Cl. .................... 365/185.28; 365/185.22; 365/185.23; 365/185.19
(58) Field of Classification Search ............ 365/185.02
See application file for complete search history.

(56) References Cited

U.S. PATENT DOCUMENTS

| | | | |
|---|---|---|---|
| 5,576,991 A | 11/1996 | Radjy et al. | |
| 5,642,311 A | 6/1997 | Cleveland et al. | |
| 5,706,240 A | 1/1998 | Fiocchi et al. | |
| 5,790,466 A | 8/1998 | Hotta | |
| 5,822,252 A | 10/1998 | Lee et al. | |
| 5,835,420 A * | 11/1998 | Lee et al. | 365/189.09 |
| 6,023,426 A | 2/2000 | Tang et al. | |
| 6,046,932 A | 4/2000 | Bill et al. | |
| 6,751,158 B2 | 6/2004 | Ryoo | |
| 7,009,882 B2 | 3/2006 | Chen | |
| 7,023,734 B2 | 4/2006 | Chen | |
| 7,239,554 B2 * | 7/2007 | Jeong | 365/185.28 |
| 7,245,537 B2 * | 7/2007 | Jeong | 365/185.22 |
| 2005/0226051 A1 | 10/2005 | Bedarida et al. | |

\* cited by examiner

*Primary Examiner*—Tan T. Nguyen
(74) *Attorney, Agent, or Firm*—Duane Morris LLP

(57) ABSTRACT

A program method for a flash memory semiconductor device includes the steps of providing a bit line voltage for programming a group of memory cells and detecting if the bit line voltage meets a selected target voltage. When the bit line voltage meets the selected target voltage, a program operation is performed on the group of memory cells. When the bit line voltage does not meet the selected target voltage, the programming operation is individually performed on at least a first subgroup of memory cells from the group and a second subgroup of memory cells from the group.

19 Claims, 6 Drawing Sheets

SEMICONDUCTOR MEMORY DEVICE HAVING IMPROVED PROGRAMMING CIRCUIT AND METHOD OF PROGRAMMING SAME

FIELD OF THE INVENTION

The present invention relates to a semiconductor memory device including an array of memory cells and more particularly to a program circuit for the memory device and a method of programming the memory device.

BACKGROUND OF THE INVENTION

FIG. 1 shows a typical configuration for an integrated circuit including a flash EEPROM (electrically erasable and programmable ROM) memory array 100 and circuitry enabling programming, erasing, reading, and overerase correction for memory cells in the array 100. The flash EEPROM array 100 is composed of individual cells, such as cell 102. Each cell has a drain connected to a bit line, such as bit line 104, each bit line being connected to a bit line switch circuit 106 and column decoder 108. Sources of the array cells are connected to each other and VSL, which is the common source signal, while their gates are each connected by a word line to a row decoder 110.

The row decoder 110 receives voltage signals from a power supply 112 and distributes the particular voltage signals to the word lines as controlled by a row address received from a processor or state machine 114. Likewise, the bit line switch circuit 106 receives voltage signals from the power supply 112 and distributes the particular voltage signals to the bit lines as controlled by a signal from the processor 114. Voltages provided by the power supply 112 are controlled by signals received from processor 114.

The column decoder 108 provides signals from particular bit lines to sense amplifiers or comparators 116 as controlled by a column address signal received from processor 114. The power supply 112 supplies voltages to column decoder 108 and bit lines 104. Power supply 112 may include a charge pump circuit or external power supply to supply the bit line current on a bit line needed during programming or overerase correction.

The sense amplifiers 116 receive a signal from reference cells of reference array 118. With signals from the column decoder 108 and reference array 118, the sense amplifiers 116 then each provide a signal indicating a state of a bit line relative to a reference cell line to which it is connected through data latches or buffers 120 to processor 114.

To program a cell in the flash memory array 100, high gate-to-source voltage pulses are provided to the cell from power supply 112 while a source of the cell is grounded. For instance, during programming multiple gate voltage pulses typically of 9-10 V are each applied for approximately three to six microseconds to a cell, while a drain voltage of the cell is set to 4-4.5 V and its source is grounded. This bias from-drain to-source generates hot electrons near the drain side. The large gate-to-source voltage pulses enable a probability of hot electrons to overcome an energy barrier between the channel and floating gate formed by a thin dielectric layer, thereby driving hot electrons onto the floating gate of the cell. This programming procedure, termed "hot electron injection" results in an increase of a threshold voltage for the cell, the threshold being the gate-to-source voltage required for the cell to conduct.

After an erase operation, there is concern with what is known in the art as "overerase." An overerased cell has a threshold voltage that is too low and provides leakage current even when the gate-to-source voltage is at 0V. The cell leakage will form a non-negligible bit line current, which leads to reading and programming errors. Therefore, overerase correction is performed to reduce this bit line current. During overerase correction, all of the cells on a bit line in the flash memory array 100 have the same gate-to-source voltage with the source grounded. The drain voltage of the cell is set to around 5V. Again, hot electrons will be injected into the floating gate to raise the threshold voltages of the cells.

During the program operation, a program-verify step is performed by applying a gate voltage of 6V to the control gate electrode of the main cell, a drain voltage of 1V to the drain, a gate voltage of 3V to the control gate electrode of a reference cell and a drain voltage of 1V to the drain.

The entire program operation is repeatedly performed for all of the memory cells in a pre-selected unit, for example for the memory cells in a word unit (i.e., 16 bits). More specifically, the program and the program-verify steps are first performed for all corresponding memory cells included in the word unit. Next, it is determined whether failed memory cells exist within the word unit. If it is determined that failed cells exist, the program step and the program-verify step are performed for the failed cells. These processes are performed until failed memory cells do not exist.

Generally, when that the program operation is performed in the word unit, the program current flowing from the drain to the source is very high. Therefore, in some prior art programming operations, the program operation is internally performed in byte units in order to increase the program efficiency and to reduce the operating current of the drain pump. In other words, the program step is first performed for the I/O (input/output)<7:0> (i.e., 8 bits) and the program step is then performed for a next I/O<15:8> (i.e., 8 bits). Next, the program-verify step is performed for the entire word unit I/O<15:0> (i.e., 16 bits). If any failed cells are detected, the above processes are repeated. If no failed cells are detected, the program operation is finished.

If the program operation is repeatedly performed, a program pulse is always applied twice for every 8 bits even though there exist passed bits among the 16 cells. In other words, assuming that the program time is 5 µs per byte, the program time is increased by an integer times every time when the failed cells occur, e.g., 5 µs×2=10 µs per byte. This stresses the charge pump that provides the bias for the program operation and also increases the total time for the program operation. Further, the retention capability of the cells can be degraded due to over-programming since the bias is repeatedly applied to already-programmed cells.

U.S. Pat. No. 6,751,158 to Ryoo describes a programming method for programming word units that seeks to address some of these concerns. A bit counter counts the total number of bits from the selected word unit that are to be programmed. If the number of bits of the data to be programmed is less than eight, the program operation is performed on the entire word, rather than splitting the word into byte units for individual programming. If the total number of bits of data to be programmed is greater than eight, the word unit is programmed as two individual byte units. The operation of the Ryoo device is predicated on the assumption that for bit counts larger than eight, the supplied programming current cannot be enough for the required bits to be programmed. Thus, the sixteen bits, which includes both bits to be programmed and those that are not to be programmed, are divided into two groups, e.g., high byte and low byte, for individual programming. Based on Ryoo's assumption, each byte will necessarily include eight or fewer bits for programming and thus the supply current will be sufficient.

The general allowable operating range for a given memory device is, for example, 2.7 to 3.6V. One problem with Ryoo's methodology is that the prediction of inadequate programming current for more than eight bits does not hold true for high VCC operating voltages (e.g., 3.6 V). Pumping current is usually much larger for high VCC voltages than for low VCC voltages (e.g., 2.7 V). Ryoo's methodology applies affords the same longer program time for each VCC environment though unnecessary for the high VCC environment. Therefore, in high VCC environments, Ryoo's methodology results in wasted programming time.

Therefore, there remains a need for a semiconductor memory device with improved programming capabilities and efficiencies.

SUMMARY OF THE INVENTION

A program method for a flash memory semiconductor device is provided. The method includes the steps of providing a bit line voltage for programming a group of memory cells and detecting if the bit line voltage meets a selected target voltage. When the bit line voltage meets the selected target voltage, a program operation is performed on the group of memory cells. When the bit line voltage does not meet the selected target voltage, the programming operation is individually performed on at least a first subgroup of memory cells from the group and a second subgroup of memory cells from the group.

A program circuit for the flash memory semiconductor device is also provided. The program circuit includes a voltage detector. The voltage detector provides a signal representing whether a bit line voltage for programming a group of memory cells meets a selected target voltage. A controller selects a program operation for programming the memory cells in a group unit or in subgroup units in response to the signal.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

Simulation tests have shown that the time needed to program an erased state cell to program state increases exponentially when the drain voltage (i.e., bit line voltage) is decreased linearly. Therefore, ensuring adequate bit line voltage is critical for efficient programming operation. The programming circuit and method described below optimize this programming operation by first determining whether adequate bit line programming voltage is provided. The programming operation is then controlled in accordance with the detection result.

Figure 2:
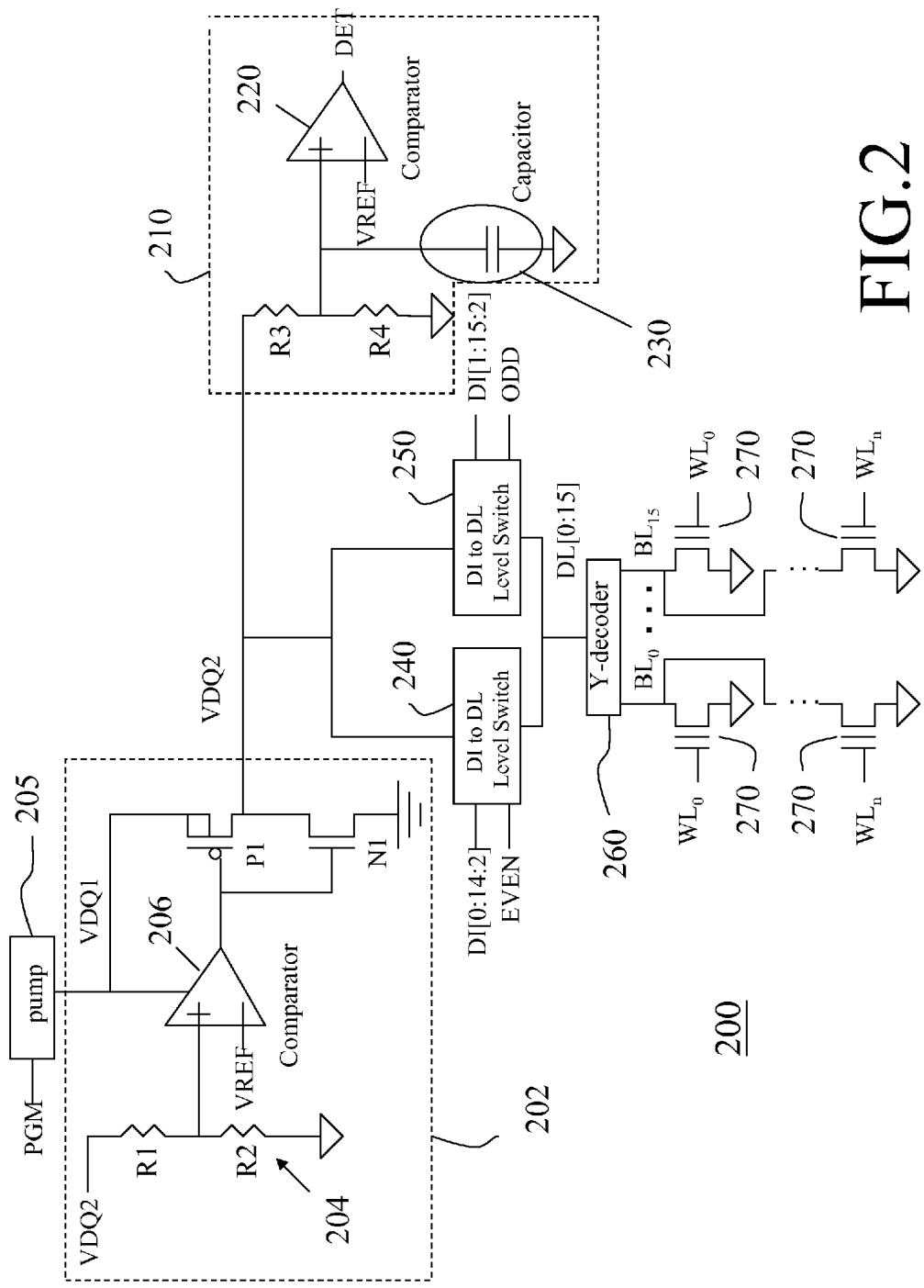
FIG. 2 is a circuit diagram of a programming circuit according to one embodiment of the present invention.

FIG. 2 is a circuit diagram of an embodiment of a programming device 200 for programming memory cells of a semiconductor memory device. In one exemplary embodiment, the semiconductor memory device is an EEPROM comprising NOR memory cells, hereinafter sometimes referred to as a "FLASH memory device." Those features of the FLASH memory device not described herein are known to those of ordinary skill in the art and need not be repeated herein. Commonly assigned U.S. Pat. No. 7,009,882 provides a detailed discussion of the FLASH memory device structure, the entirety of which is hereby incorporated by reference herein.

The programming device includes a power supply, such as charge pump circuit 205, that provides voltage value VDQ1 in response to a program control signal PGM. Various structures for charge pump circuit 205 are known in the art. Generally, charge pumps use capacitors as energy storage elements and some form of switching device to control connection of voltages to the capacitor. The pump circuit may also include an output capacitor for smoothing the output voltage. Higher loads result in lower average voltages, so the voltage can vary. A voltage regulator circuit 202 is coupled to the output of the pump circuit 205. As is known in the art, the voltage regulator circuit includes a resistive voltage divider 204, comparator 206, PMOS P1 and NMOS N1. Regulated voltage VDQ2 is provided at the drain nodes of transistors P1 and N1. Even though the voltage is regulated, it is load dependent and thus can dip below its target voltage. If the maximum supplied current of the pump is not enough, the regulation function of the regulator will "fail" and the VDQ2 voltage will drop to below the regulation target voltage until the current drawn by cell array equals the maximum supplied current of the pump.

The supply voltage VDQ1 is regulated to a target drain voltage value VDQ2 by differential amplifier 206. Normally VDQ1 is higher than the regulated target of VDQ2 because VDQ1 is the supply source for VDQ2. The regulated target voltage is determined by the ratio of R1 and R2, as well as the value of reference voltage VREF. The target value for voltage VDQ2 is set to $((R2+R1)/R2)*VREF$. VREF is a reference voltage provided by, for example, a reference voltage sub-circuit (not shown). In embodiments, the reference voltage VREF is set to about 1.25 V and the regulated target voltage VDQ2 is set based upon the program characteristics of the flash cells, which is determined by the drain voltage needed for programming the flash cells taking into consideration any voltage drops due to bit line switches on the bit lines. In one embodiment, VDQ2 is between about 4.0-4.5 V.

Comparator 206 along with MOSs P1 and N1 can be viewed as an operational amplifier. P1 is controlled by the output of comparator 206 to draw charge from VDQ1 when VDQ2 is lower than regulation target. N1 is used to leak charge from VDQ2 if VDQ2 is higher than the regulation target.

A capacitor (not shown) can be coupled between node VDQ2 and ground. This capacitor reduces the variation in VDQ2 when its source, VDQ1, is pumped. A leakage path circuit (not shown) familiar to those in the art may also be provided.

The bit line voltage value is indicative of whether there is adequate bit line current for programming cells within a selected programming period. Therefore, programming circuit 200 also includes a bit line voltage detector or comparison circuit 210 (hereinafter referred to as "detector circuit") for sensing or detecting the bit line voltage. The detector circuit 210 includes a comparator 230 having its positive input coupled to node VDQ2 through a voltage divider circuit, which includes resistors R3 and R4. The negative input of the comparator 230 is coupled to reference voltage VREF, which can be the same voltage signal VREF provided to comparator 206. A low pass filter 230, such as a capacitor C1, is also coupled to the positive input node. The filter 230 filters out ripple in the VDQ2 voltage level. The detection level is set by the ratio of R3 and R4, as well as the reference voltage VREF.

As mentioned above, to determine the detection level, the programming characteristics of the flash cells 270 should be considered, while taking into account any expected voltage drops between node VDQ2 and the drain terminals of the flash cells 270.

When VDQ2 is too low when compared with the target voltage value, signal DET issued by comparator 220 is low. When VDQ2 is higher than the target voltage value, signal DET is high. From an operating perspective of the comparator, the voltage value at its positive input is either less than the reference voltage VREF or greater than VREF, but never equal.

Figure 1:
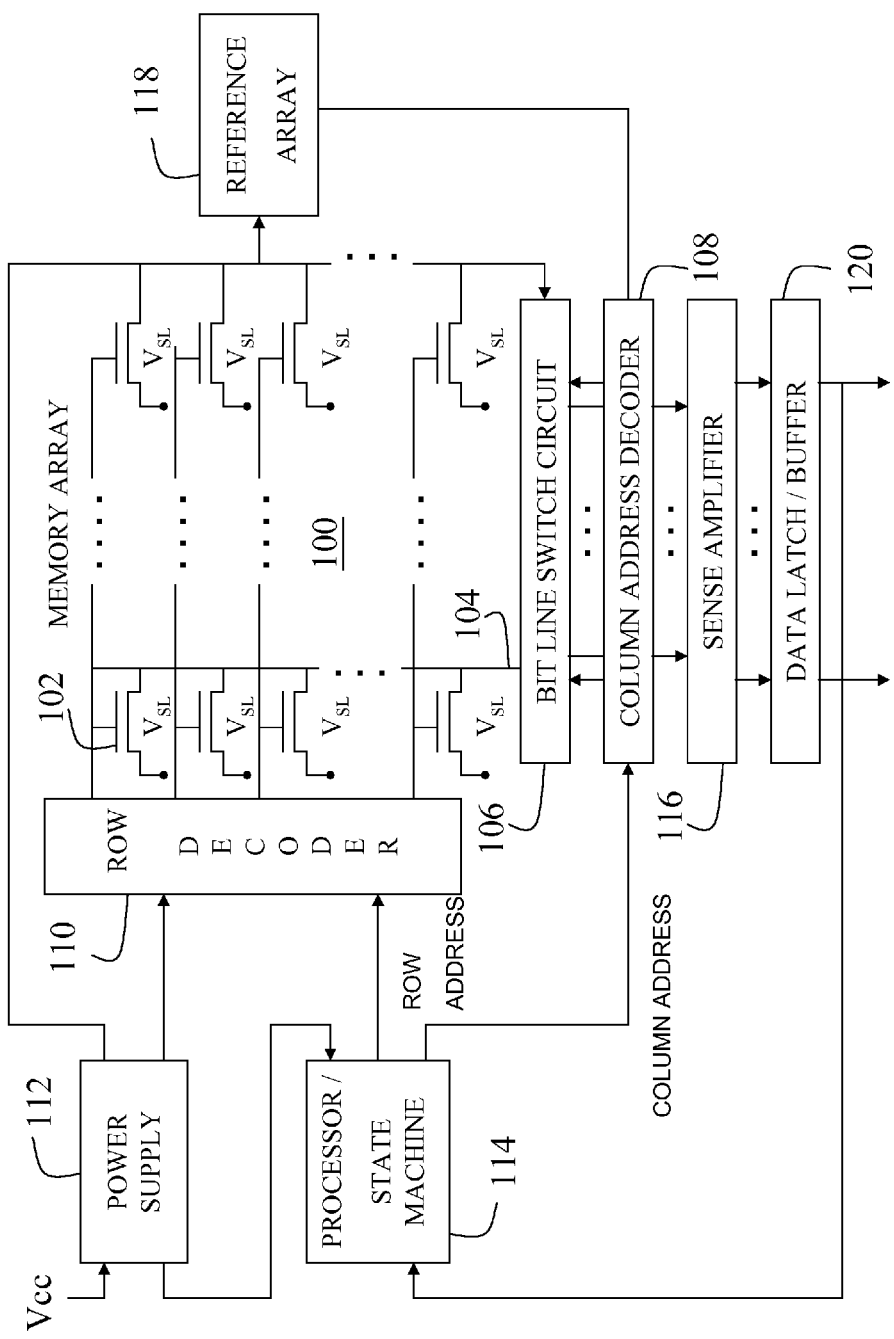
FIG. 1 shows a typical prior art configuration for an integrated circuit including a flash EEPROM memory array and circuitry enabling programming, erasing, reading and overerase correction in the array.

FIG. 2 shows bit lines BL0 to BL15 coupled to Y-decoder 260. Each bit line has a plurality of FLASH cells 270 with drain terminals coupled to the respective bit line. Each cell has its respective gate terminal coupled to a respective word line WL[0:n]. The common source line is shown grounded. Although only two bit lines 104 and two word lines are illustrated, it should be understood that any number of bit lines and words lines, and thus any number of cells, may be included in a memory array. Multiple bit lines are selected by the Y-decoder 260, which comprises bit line switches, such as described above in connection with FIG. 1, corresponding to each bit line BL. Y-decoder 260 can comprise column address decoder 108 and bit line switch circuit 106 from FIG. 1. Once a corresponding bit switch is turned on, the corresponding bit line is activated (i.e., coupled to node VDQ2) and individual cells 270 are selected for programming via the word line signals WL0:WLn.

As those of ordinary skill in the art will recognize, the memory array typically includes multiple I/Os, such as 16 I/Os in word mode. Each I/O includes multiple bit lines BL and one bit line is selected from each I/O for reading or programming, i.e., one bit line is selected from each 16 I/Os in word mode (for a total of 16 bit lines and 16 bits) for reading or programming. Each I/O corresponds to one internal data line signal, DL (shown as DL[0] through DL[15]), and multiple bit lines. Signal DL[n] is a global signal shared by many local bit lines with a common I/O, although FIG. 2 illustrates only one bit line per I/O so as to not unnecessarily obscure the present invention. If a "0" is to be programmed to a selected cell 270 from a selected bit line BL from a selected I/O, the respective bit line associated with the I/O is turned on to receive the bit line programming voltage. If a "1" is to be programmed to the cell, the corresponding bit line from the I/O is turned off.

The VDQ2 voltage is passed to cells that are selected to be programmed through DI to DL Level Switches 240 and 250 and Y-decoder 260. DI[0:15] represents the data input signal bus which shows which bits should be programmed. DL[0:15], which is controlled by DI[0:15], represents the bus path for passing the needed drain current voltage to the Y-decoder 260. The Y-decoder 260 selects a bit line address, including 16 bit lines for programming. As mentioned above, the voltage drops across these circuits should be considered in determining the desired target voltage level for VDQ2. The VDQ2 voltage must be high enough to program erased cells but low enough to avoid making the bit line voltage of the program state cells reach the break down voltage of their drain junctions. Bits that are to be programmed are initially in erased state but switch to the programmed stated during the program operation.

In the illustrated embodiment, the DI to DL level switch of the programming circuit 200 is divided into first switch part 240 and second switch part 250. First switch part 240 is controlled by signal EVEN and second part 250 is controlled by signal ODD. These control signals are described below in connection with FIGS. 3 and 4. Briefly though, DI to DL level switch 240 provides appropriate control signals within DL[0:15], i.e., DL[0:14:2], for instructing the Y-decoder 260 to activate corresponding bit lines when the EVEN control signal is high, and DI to DL level switch 250 provides appropriate control signals within DL[0:15], i.e., DL[1:15:2], for instructing the Y-decoder 260 to activate corresponding bit lines when the ODD control signal is high. DI[0:14:2] means DI[0], DI[2], DI[4], . . . , DI[14], and DI[1:15:2] means DI[1], DI[3], DI[5], . . . , DI[15]. As will be familiar to those of ordinary skill in the art, the Level switch circuits 240, 250 can comprise any kind of level shifter that makes DL[n]=0V if DI[n]=0, and DL[n]=VDQ2 if DI[n]=1. In its simplest form, the level switches 240, 250 can comprise a plurality of switches for selectively passing voltage VDQ2 under control of signals EVEN and ODD and under control of DI[0:15].

Figure 4:
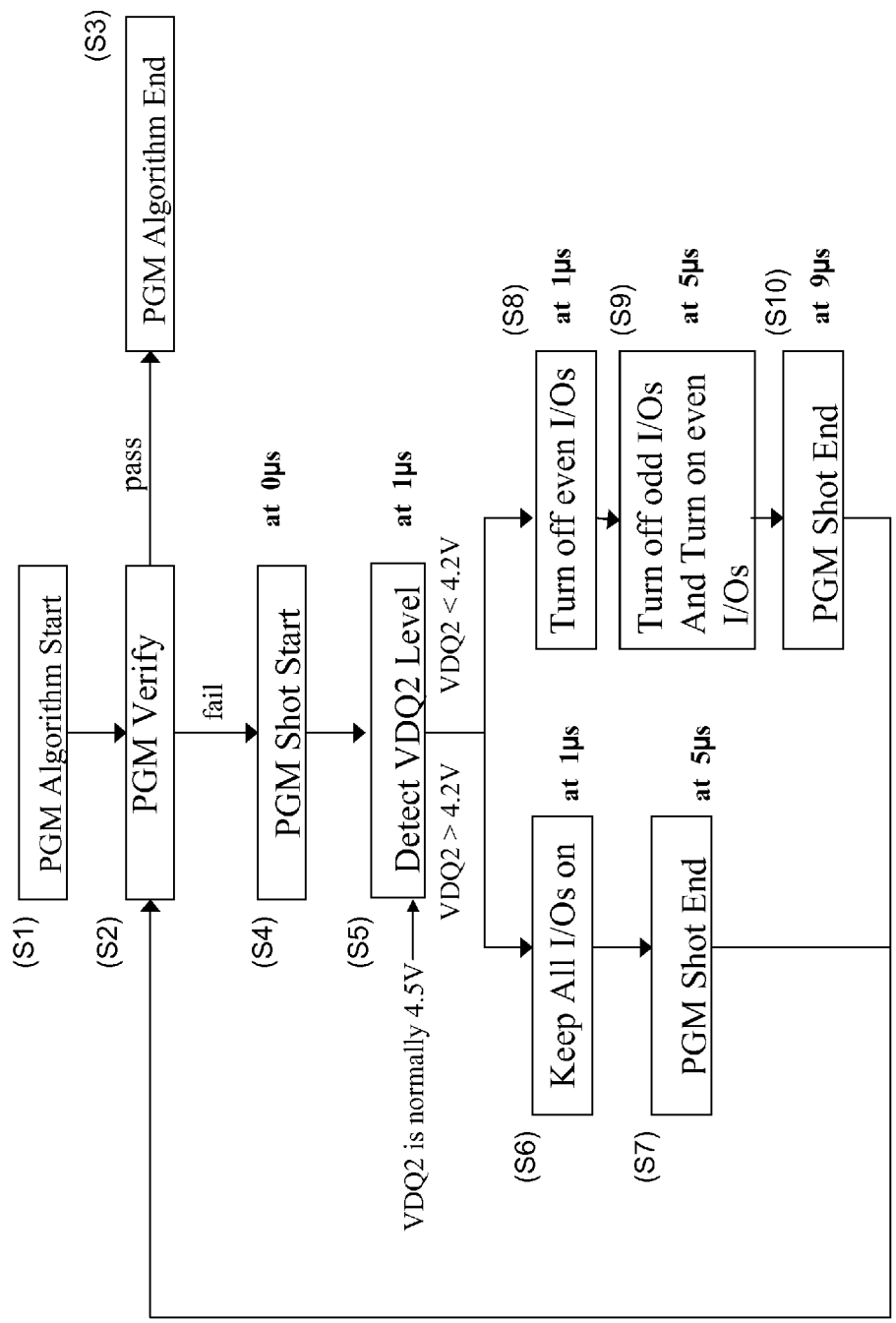
FIG. 4 is a flow chart illustrating the operation of the programming circuit of FIG. 2.

FIG. 4 is a flow chart showing the operation of the programming circuit 200. At Step S1, the program algorithm begins. At step S2, a program verify step is performed. It is preferred to perform a program verify step before programming of the cells so as to avoid unnecessary programming or over-programming. If programming is not needed, the programming algorithm ends at step S3.

Assuming program verify fails, meaning cells need to be programmed, programming commences at step S4, corresponding to time 0 μs. Both the EVEN and ODD signals are initially set high when program control signal PGM is turned high. Assume the detection level for detection circuit 210 is 4.2 V. This voltage value assumes 0.4V voltage drops on the bit line selection circuitry and that a 3.8V bit line voltage is the minimum voltage needed for programming. Before detection occurs at Step S5 (1 μs), all selected bits are being programmed because EVEN and ODD are initially high. At Step S5, the output (DET) of the detector circuit 210 is read to determine if under this word unit programming condition the bit line voltage VDQ2 reached its target value of 4.2 V. Whether the bits are to be programmed thereafter as a word unit or in some subgroup of the word unit (e.g., byte units) is determined by the output DET. If the bit line voltage meets the target voltage, the selected bit lines of all of the I/Os of the word unit are kept on by keeping both signals ODD and EVEN high (Step S6). After the programming period, which in the illustrated embodiment is 4 μs, the programming operation ends (step S7). A program verify step (S2) is then performed. If the program verification failed, the algorithm proceeds to step S4 to repeat the process. If the program verification was successful, the programming operation terminates (Step S3). If at Step S5 the bit line voltage did not reach the target voltage, half of the I/Os are turned off (Step S8), i.e., either the even I/Os or odd I/Os. Though FIG. 4 shows the even I/Os are turned off at Step S8, either the even or odd I/Os or some other selected subgroup (e.g., high and low bytes) could be turned off. After one programming period, e.g., 4 µs, the first subgroup, i.e., even I/Os, is turned off and the second subgroup, i.e., odd I/Os, is turned on (Step S9). This condition is maintained for another programming period, e.g., 4 µs. This second programming period ends at Step S10. If the program operation failed (Step S2), the algorithm proceeds to step S4 to repeat the process. If the program operation was successful, the programming operation terminates (Step S3).

Figure 5:
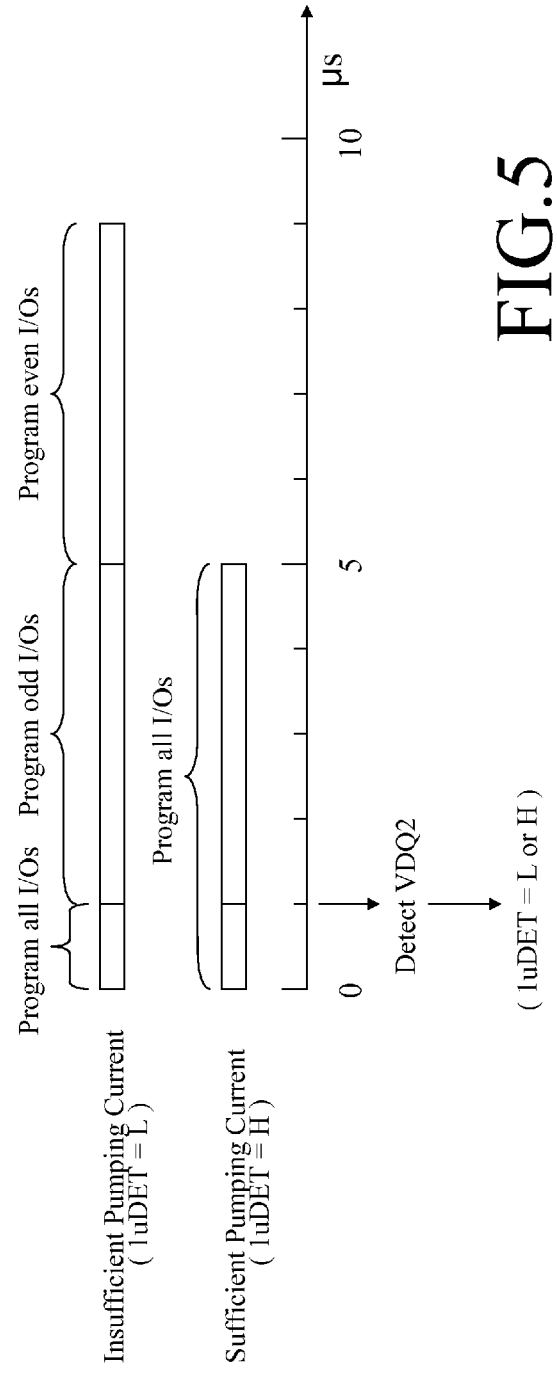
FIG. 5 is a timing diagram corresponding to the operation illustrated in FIG. 4.

The timing sequence for programming operation is shown in FIG. 5 in the case where the programming voltage is determined to meet the predetermined target voltage and in the case where the bit line programming voltage is determined to be too low.

Figure 3:
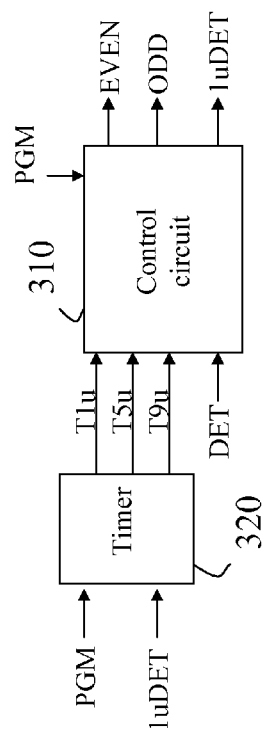
FIG. 3 illustrates an exemplary controller for providing control signals to the programming circuit of FIG. 2.

Referring to FIG. 3, a controller 300 for issuing control signals for the programming circuit 200 is shown. Controller 300 includes a timer 320 and control circuit 310 coupled to the timer 320. At time 0 µs, global control signal PGM is issued and provided to the timer 320. Timer 320 is configured to count to 9 µs and is also configured to issue control signals T1$u$ at 1 µs, T5$u$ at 5 µs and T9$u$ at 9 µs as described hereafter. Those of ordinary skill in the art will recognize that any number of timing circuits known in the art may be utilized for timer 320. In embodiments, timer 320 can operate using the local oscillator signal of the semiconductor memory device. In embodiments, the timer 310 is a synchronous counter with signal PGM as the enable signal of this timer and 1$u$DET determining when to stop timer and to switch the PGM signal state (now shown).

At 1 µs, control signal T1$u$ is issued by timer 320 and provided to control circuit 310. Control signal T1$u$ triggers control circuit 310 to latch control signal DET from detector circuit 210. Signals EVEN and ODD are provided by control circuit 310, which both go high at time 0 µs upon issuance of signal PGM prior to detection at time 1 µs. Control circuit 310 also outputs timer control signal 1$u$DET based on the value of DET. This timer control signal 1$u$DET is provided to timer 320 to control its operation. For example, if DET is high, meaning the bit line voltage has reached its target voltage as detected at time 1 µs, then timer control signal 1$u$DET is set high. Responsive to high timer control signal 1$u$DET, timer 320 is configured to issue control signal T5$u$ at time 5 µs and then stop counting. When control signal T5$u$ is issued and DET is high, instructs control circuit 310 switches signals EVEN and ODD to low, effectively ending the programming of the EVEN and ODD I/Os.

If DET is low, meaning the bit line voltage has not reached its target voltage at detection time 1 µs, then timer control signal 1$u$DET is set low. Control circuit 310 turns signal EVEN to low upon receipt of low DET, so that only odd I/Os are programmed. Responsive to low timer control signal 1$u$DET, timer 320 is configured to again issue control signal T5$u$ at 5 µs, but continues counting to 9 µs at which time it issues control signal T9$u$. Control circuit 310 switches control signal EVEN to high and ODD to low in response to signal T5$u$ when DET is low, so as to end the programming of the odd I/Os and continue programming of the even I/Os. The control circuit 310 then switches signal EVEN to low in response to signal T9$u$ so that both ODD and EVEN are low, effectively ending the programming of the EVEN I/Os.

By way of example, using the programming circuit 200 described above, the programming operation takes about 8 µs when there is adequate bit line voltage for word unit (16 bits) programming. That is, 5 µs for the programming operation, 2 µs for program verification and an assumption of 1 µs for entering and exiting the program algorithm. When the circuit 200 detects that there is inadequate bit line voltage for programming, and thus programming occurs in subgroups (e.g., byte units), the programming operation takes 12 µs, which represents an increase of only 50%. That is, 9 µs for the programming operation, 2 µs for program verification and 1 µs for entering and exiting the programming algorithm. With prior art programming methods such as described in the Background of the Invention Section, an inadequate programming voltage will leave at least some cells that cannot be programmed during a single program operation, which uses the low programming voltage. The program sequence, therefore, must be repeated at least once. This prior art programming operation would consume significantly more time, particularly in high VCC environments. Consider the following examples.

Assume the pump output current at VCC=2.7V (or <3V) is not enough for programming more than 8 bits at a time, but that at VCC=3.6V (or >3V) the output current is adequate. For VCC=2.7V and programming of more than 8 bits, the prior art methodology needs 0.5 µs (to enter the programming algorithm)+1 µs (for program verification)+5 µs (to program the first byte)+5 µs (to program the second byte)+1 µs (for program verification)+0.5 µs (to exit the programming algorithm) for a total of 13 µs. In contrast, the new programming methodology described above requires 12 µs, an improvement of 1 µs.

For VCC=3.6V and more than 8 bits are to be programmed, the prior art methodology still needs 13 µs as described above, despite there being adequate programming current from this high VCC condition. The new programming methodology requires only 8 µs as described above, an improvement over the prior art methodology of 5 µs.

Figure 6:
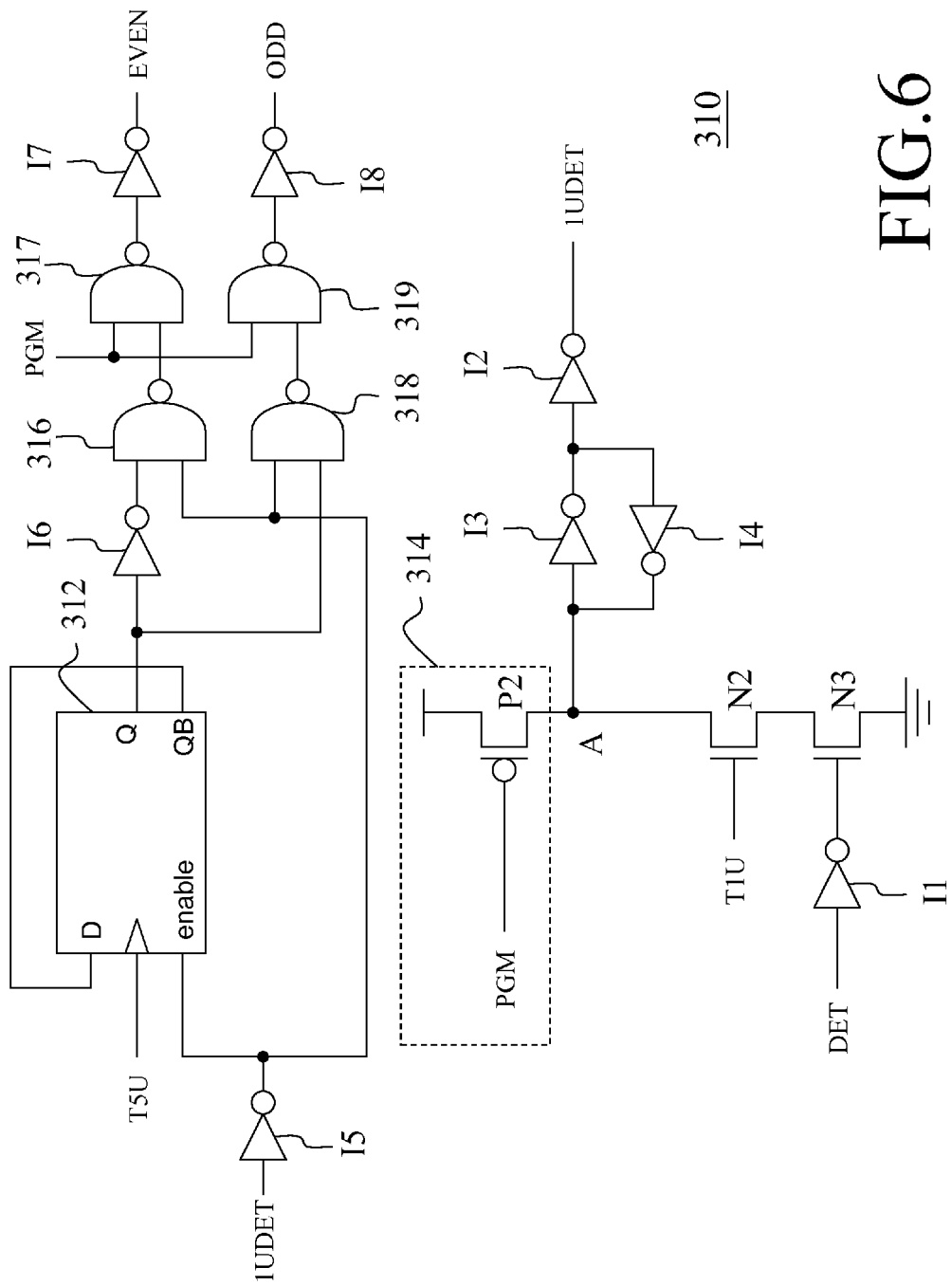
FIG. 6 is a circuit diagram of the control circuit module of the controller of FIG. 3.
Figure 7:
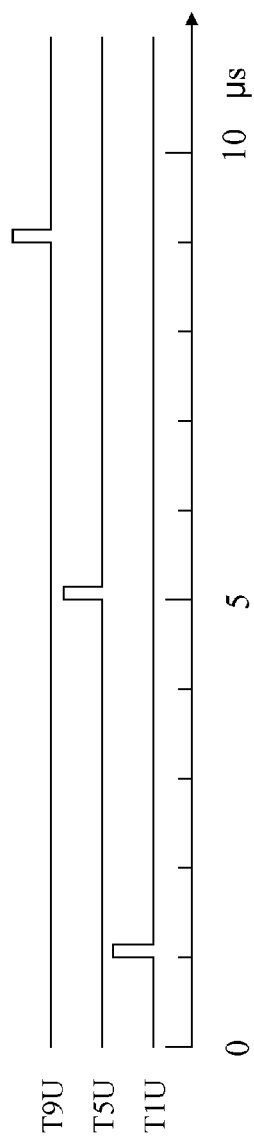
FIG. 7 is a time diagram showing signals issued by the timer of FIG. 3.

FIG. 6 is a circuit diagram of one embodiment of the control circuit 312 of FIG. 3. FIG. 7 is a timing diagram showing pulse signals T1$u$, T5$u$ and T9$u$ issued by timer 320 in FIG. 3. Turning to FIG. 6, node "A" is initially set to high by block 314. Node A is set high by providing program command PGM to PMOS switch P2. At time 1 µs, the timer 320 issues pulse T1$u$, node A is set to the level of signal DET. More specifically, NMOS N2 is on while T1$u$ is high and if DET is high, meaning the bit line voltage has reached its target value, then the output of inverter I1 is low and NMOS N3 is off. This leaves node A high. If DET is low, meaning the bit line voltage has not reached its target value, the output of inverter I1 is high and NMOS N3 is on. This pulls node A low. The value at A is latched to an inverter I3 through a latch circuit, which includes, for example, cross-coupled inverters I3 and I4. The latched value is inverted by inverter I3 and then inverted by inverter I2 to provide signal 1$u$DET corresponding to the value of DET.

In one embodiment, the control circuit 310 also includes a D flip-flop 312, inverters I5 and I6, and two NAND gates 316 and 318. NAND gates 316 and 318 provide control signals EVEN and ODD, respectively, based on their inputs. One input of each NAND gate 316 and 318 is coupled to the output of inverter I5, and thus to the inversion of signal 1$u$DET. The second input of NAND 316 is coupled to data output Q through inverter I6. Alternatively, the second input of NAND 316 can be coupled to data output QB and inverter I6 can be removed. The second input of NAND 318 is coupled to data output Q.

NAND gates 317 and 319 and inverters I7 and I8 are provided in one embodiment to force signals EVEN and ODD low in response to signal PGM, i.e., when the program operation ends.

If 1uDET is high, the first input of both NAND 316 and NAND 318 is low. Signals EVEN and ODD are high under this condition. The flip flop 312 is disabled when 1uDET is high.

Initially, Q is set low. When 1uDET is low, the flip flop 312 is enabled. Signal ODD is initially high because its first input (from Q) is low and its second input (inverted 1uDET) is high. Signal EVEN is low because both of its inputs are high. When timer pulse signal T5u is issued, the output Q is set to the value of data node D, which is coupled to output QB. Essentially, output Q is switched from low to high. With Q high, NAND 318 sets signal ODD low. NAND 316 turns signal EVEN high. When signal T9u is issued, PMOS P2 of block 314a is turned on, setting node A to high again and resetting signal 1uDET to high to disable flip flop 312. Alternatively, as shown in block 314b, PMOS P2 can be coupled to signal PGM to drive node A high when signal PGM goes low.

Figure 8:
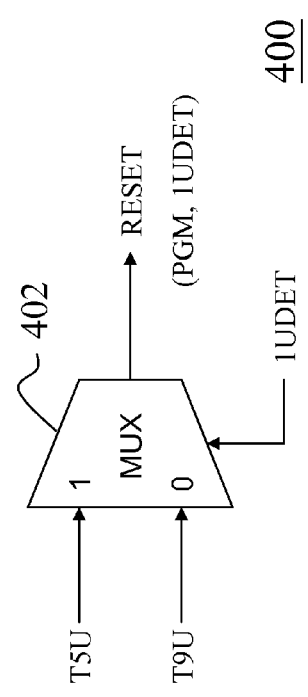
FIG. 8 shows a circuit for resetting the program and timing control signals of FIGS. 3 and 6.

FIG. 8 shows one embodiment of a circuit 400 for providing a RESET control signal which may be used to reset control signals PGM and 1uDET depending on whether programming should be concluded at a first time (e.g., 5 µs) when the programming voltage meets its target voltage or a second time (e.g., 9 µs) when the programming voltage does not meet its target voltage. In this embodiment, the circuit 400 includes a multiplexer 402 which receives timing signals T5u and T9u and timing control signal 1uDET as its inputs. The multiplexer 402 selectively issues a RESET control signal for resetting signal PGM to low and timing control signal 1uDET to high. When 1uDET is high, meaning DET is high and the programming voltage met its target voltage, the multiplexer 402 operates to reset signals PGM and 1uDET in response to signal T5u. When 1uDET is low, meaning DET is low and the programming voltage did not meets its target voltage, the multiplexer 402 operates to reset signals PGM and 1uDET in response to signal T9u.

Though the programming operation and method are described above in connection with programming a cell from an initial erase state to a program state, the programming circuit and method also apply to soft programming of cells. Soft programming is also known in the art as overerase correction. As those in the art will understand, soft programming is used after erasing to correct the overerased cells, i.e., cells where the threshold voltage is too low (e.g., below 1V) to have a higher threshold. During soft program, the word line voltage is set to 0 V or a negative voltage such as −0.5 V or −1.0 V rather than 8.0 V.

Still further, though the programming circuit and method are described in connection with programming word sized memory units, the circuit and method are equally applicable to programming smaller or larger sized memory units. Still further, though the memory group for programming is described as being broken into two subgroups when it is detected that a target bit line programming voltage is not available, in embodiments the group could be broken into more than two subgroups. Modifications to the level switch circuits 240, 250 and to controller 300 to operate with more than two subgroups will be apparent to those of ordinary skill in the art based on the details provided in this disclosure.

Still further, in another alternative embodiment, more than one detection operation can be performed. For example, a second detection is triggered 1 µs after the first detection (e.g., at time 2 µs). If at the second detection it is determined that inadequate bit line programming voltage is still not present, the group of cells to be programmed can be divided further into one or more additional subgroups. This detection and subgroup creation process continues until adequate bit line programming voltage is detected. At that point, the subgroups are sequentially programmed as discussed above.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A program method for a flash memory semiconductor device comprising the steps of:
   providing a bit line voltage for programming a group of memory cells;
   detecting if said bit line voltage meets a selected target voltage;
   when said bit line voltage meets said selected target voltage, performing a program operation on said group of memory cells; and
   when said bit line voltage does not meet said selected target voltage, individually performing said program operation on at least a first subgroup of memory cells from said group and a second subgroup of memory cells from said group.

2. The program method of claim 1, wherein said group of memory cells is a word unit and said first and second subgroups are byte units.

3. The method of claim 1, further comprising the steps of issuing a program command, said program command triggering said providing step, and waiting a predefined period of time before performing said detecting step.

4. The method of claim 1, further comprising the step of prior to said detecting step beginning said programming operation on said group of memory cells, wherein said individually performing said programming operation step comprises the following steps:
   stopping said programming operation on said first subgroup of memory cells while continuing said programming operation on said second subgroup of memory cells; and
   after a predefined period of time, stopping said programming operation on said second subgroup of memory cells and continuing said programming operation on said first subgroup of memory cells.

5. The method of claim 1, further comprising the step of performing a program verify step after said program operation.

6. The method of claim 1, wherein said providing step comprises generating said programming voltage with a pump circuit.

7. A program circuit for a flash memory semiconductor device, said program circuit comprising:
   a voltage detector, said voltage detector providing a signal representing whether a bit line voltage for programming a group of memory cells meets a selected target voltage; and
   a controller for selecting a program operation for programming said memory cells in a group unit or in subgroup units in response to said signal.

8. The program circuit of claim 7, wherein when said bit line voltage meets said selected target voltage, said controller selects the program operation for programming said memory cells in a group unit.

9. The program circuit of claim 7, wherein when said bit line voltage does not meet said selected target voltage, said controller selects the program operation for programming said memory cells in subgroup units.

10. The program circuit of claim 9, wherein said subgroup units are individually programmed at different times.

11. The program circuit of claim 9, wherein said controller first selects the programming operation for programming said memory cells in a group unit until it determines said bit line voltage does not meet said selected target voltage.

12. The program circuit of claim 7, further comprising a voltage regulator for providing said bit line voltage.

13. The program circuit of claim 12, further comprising a charge pump circuit coupled to said voltage regulator.

14. The program circuit of claim 7, wherein said group of memory cells is a word unit and said first and second subgroups are byte units.

15. The program circuit of claim 7, wherein said voltage detector comprises a comparator.

16. The program circuit of claim 7, wherein said controller issues control commands for selecting bit lines for biasing with said bit line programming voltage corresponding to said group unit and subgroup units.

17. The program circuit of claim 7, further comprising a decoding circuit coupled to said a plurality of bit lines associated with said group of memory cells, said decoding circuit selecting said bit lines for biasing with said bit line programming voltage under control of said controller.

18. The program circuit of claim 7, wherein said controller comprises a timing circuit, said timing circuit issuing a control signal triggering said controller to examine said voltage detector signal at a predefined time.

19. A flash EEPROM semiconductor memory device comprising:
 a charge pump circuit;
 a voltage regulator coupled to said charge pump circuit for providing a bit line programming voltage;
 a memory array comprising a plurality of flash memory cells coupled to a plurality of addressable word lines and a plurality of addressable bit lines;
 a voltage detector circuit, said voltage detector circuit providing a detection signal representing whether a bit line voltage for programming a group of said memory cells meets a selected target voltage;
 a controller for selecting a program operation for programming said memory cells in response to said detection signal in a word unit when said bit line voltage meets said selected target voltage and for programming said cells in byte units when said bit line voltage does not meet said selected target voltage; and
 a bit line selection circuit for passing said bit line voltage to bit lines corresponding to said word unit and byte units under control of said controller for implementing said programming operation.

* * * * *